(12) United States Patent
Knopp et al.

(10) Patent No.: US 6,639,932 B1
(45) Date of Patent: Oct. 28, 2003

(54) VERTICAL-CAVITY SURFACE-EMITTING LASER (VCSEL) WITH CAVITY COMPENSATED GAIN

(75) Inventors: Kevin J. Knopp, Amesbury, MA (US); Daryoosh Vakhshoori, Cambridge, MA (US); Peidong Wang, Bellerica, MA (US)

(73) Assignee: CoreTek, Inc., Billerica, MA (US)

(*) Notice: Subject to any disclaimer, the term of this patent is extended or adjusted under 35 U.S.C. 154(b) by 0 days.

(21) Appl. No.: 10/020,067

(22) Filed: Dec. 14, 2001

Related U.S. Application Data
(60) Provisional application No. 60/276,402, filed on Mar. 16, 2001.

(51) Int. Cl.⁷ ............................ H01S 3/08; H01S 3/091; H01S 3/094
(52) U.S. Cl. ............................................ 372/96; 372/75
(58) Field of Search ............................ 372/75, 96, 43, 372/12

(56) References Cited

U.S. PATENT DOCUMENTS

| | | | | |
|---|---|---|---|---|
| 5,115,441 A | * | 5/1992 | Kopf et al. | 372/45 |
| 5,933,444 A | * | 8/1999 | Molva et al. | 372/75 |
| 5,981,360 A | * | 11/1999 | Rabarot et al. | 438/455 |
| 5,982,802 A | * | 11/1999 | Thony et al. | 372/75 |
| 6,434,180 B1 | * | 8/2002 | Cunningham | 372/50 |

FOREIGN PATENT DOCUMENTS

| | | |
|---|---|---|
| WO | WO 99/34484 | 7/1999 |
| WO | WO 00/62384 A1 | 10/2000 |

* cited by examiner

*Primary Examiner*—Paul Ip
*Assistant Examiner*—Phillip Nguyen
(74) *Attorney, Agent, or Firm*—Pandiscio & Pandiscio, P.C.

(57) ABSTRACT

In one form of the invention, there is provided a laser comprising a front mirror and a rear mirror which are disposed so as to establish a reflective cavity therebetween; a gain region disposed between the front mirror and the rear mirror, the gain region being constructed so that when it is appropriately stimulated by light from a pump laser, the gain region will emit light; one of the front mirror and the rear mirror is substantially fully reflective at the lasing wavelength and the other of the front mirror and rear mirror being partially reflective at the lasing wavelength so as to allow a beam of laser light to be emitted therefrom; and an intermediate mirror disposed between the rear mirror and the front mirror, at least a portion of the gain region being disposed between the rear mirror and the intermediate mirror, the rear mirror and the intermediate mirror being reflective at the pump wavelength and being spaced from one another so as to cause the pump light to be reflected between the rear mirror and the intermediate mirror so that the pump light will make multiple pumping passes through the gain region, whereby to yield an increased observed, or "wall-plug", efficiency. In one preferred form of the invention, the gain region is formed by multiple quantum wells (MQW) which act as the intermediate mirror.

12 Claims, 2 Drawing Sheets

VERTICAL-CAVITY SURFACE-EMITTING LASER (VCSEL) WITH CAVITY COMPENSATED GAIN

REFERENCE TO PENDING PRIOR PATENT APPLICATION

This patent application claims benefit of pending prior U.S. Provisional Patent Application Serial No. 60/276,402, filed Mar. 16, 2001 by Kevin J. Knopp et al. for VERTICAL-CAVITY SURFACE-EMITTING LASER WITH CAVITY COMPENSATED GAIN which patent application is hereby incorporated herein by reference.

FIELD OF THE INVENTION

This invention relates to photonic devices in general, and more particularly to lasers.

BACKGROUND OF THE INVENTION

Lasers are well known in the art. A laser typically comprises a front mirror and a rear mirror which are disposed so as to establish a reflective cavity therebetween. An active, or gain, region is disposed between the front mirror and the rear mirror. The gain region is constructed so that when the gain region is appropriately stimulated, it will emit light. The rear mirror is typically substantially fully reflective at the lasing wavelength, and the front mirror is typically partially reflective at the lasing wavelength so as to allow a beam of laser light to be emitted therefrom.

As is well known in the art, the gain region may be stimulated by electrical current ("electrically pumped") or it may be stimulated by light ("optically pumped").

The present invention is directed to optically pumped lasers and, more particularly, to an improved optically pumped laser having an increased observed, or "wall-plug", efficiency.

SUMMARY OF THE INVENTION

The present invention comprises an improved optically pumped laser having increased efficiency.

In one form of the invention, there is provided a laser comprising:

a front mirror and a rear mirror which are disposed so as to establish a reflective cavity therebetween;

a gain region disposed between the front mirror and the rear mirror, the gain region being constructed so that when the gain region is appropriately stimulated by light from a pump laser, the gain region will emit light;

one of the front mirror and the rear mirror is substantially fully reflective at the lasing wavelength, and the other of the front mirror and the rear mirror is partially reflective at the lasing wavelength so as to allow a beam of laser light to be emitted therefrom; and an intermediate mirror disposed between the rear mirror and the front mirror, at least a portion of the gain region being disposed between the rear mirror and the intermediate mirror, the rear mirror and the intermediate mirror being reflective at the pump wavelength and being spaced from one another so as to cause the pump light to be reflected between the rear mirror and the intermediate mirror so that the pump light will make multiple pumping passes through the gain region, whereby to yield an increased observed, or "wall-plug", efficiency.

In one preferred form of the invention, the gain region is formed by multiple quantum wells (MQW) which act as the intermediate mirror.

BRIEF DESCRIPTION OF THE DRAWINGS

These and other features of the present invention will be more fully disclosed by the following detailed description of the preferred embodiments of the invention, which is to be considered together with the accompanying drawings wherein like numbers refer to like parts and further wherein.

DETAILED DESCRIPTION OF THE PREFERRED EMBODIMENTS

Figure 1:
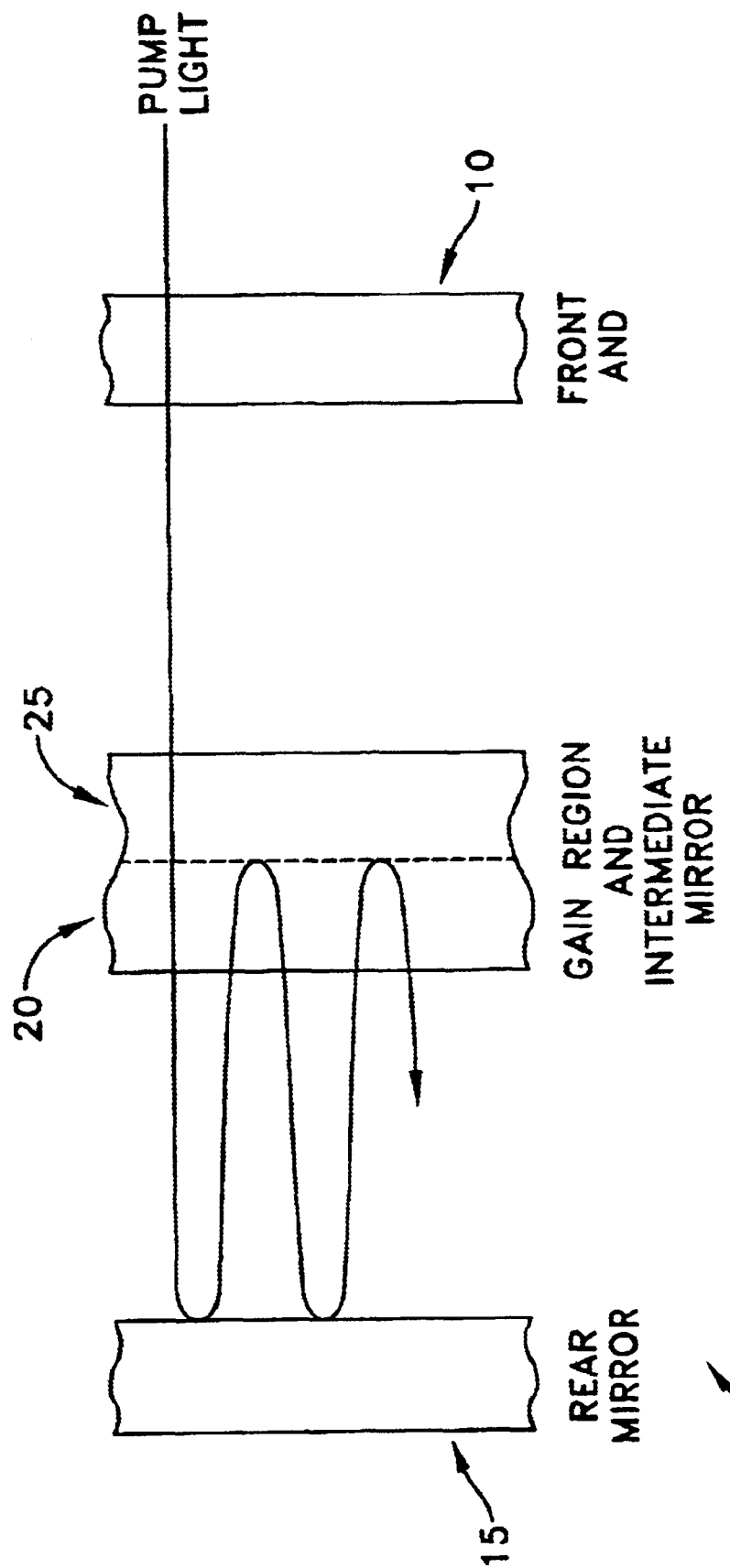
FIG. 1 is a schematic diagram showing how the pump light is reflected by the rear mirror and the intermediate mirror so as to make multiple pumping passes through the gain region.

Looking first at FIG. 1, there is shown a schematic diagram of a novel laser 5 formed in accordance with the present invention.

Laser 5 comprises a front mirror 10 and a rear mirror 15 which are disposed so as to establish a reflective cavity therebetween.

A gain region 20 is disposed between front mirror 10 and rear mirror 15. The gain region is constructed so that when the gain region is appropriately stimulated by light from a pump laser, gain region 20 will emit light.

One of front mirror 10 and rear mirror 15 is substantially fully reflective at the lasing wavelength, and the other of front mirror 10 and rear mirror 15 is partially reflective at the lasing wavelength so as to allow a beam of laser light to be emitted therefrom.

An intermediate mirror 25 is disposed between rear mirror 15 and a front mirror 10, with at least a portion of gain region 20 being disposed between rear mirror 15 and intermediate mirror 25. Rear mirror 15 and intermediate mirror 25 are reflective at the pump wavelength and are spaced from one another so as to cause the pump light to be reflected between rear mirror 15 and intermediate mirror 25 so that the pump light will make multiple pumping passes through gain region 20, whereby to yield increased efficiency.

Thus, a first Fabry-Perot cavity is provided for lasing, and a second Fabry-Perot cavity is provided for the pump.

In one preferred form of the invention, gain region 20 is formed by multiple quantum wells (MQW) which are approximately a quarter-wavelength thick so that the gain region will also act as the intermediate mirror.

The composition and spacing of front mirror 10, rear mirror 15 and gain region 20 are coordinated with the lasing wavelength, and the composition and spacing of rear mirror 15, intermediate mirror 25 and gain region 20 are coordinated with the pump wavelength so as to provide a laser with an increased observed, or "wall-plug", efficiency. By way of example but not limitation, where the lasing wavelength is $\lambda_L$ and the pump wavelength is $\lambda_P$, front mirror 10 and rear mirror 15 might comprise distributed Bragg reflectors formed out of alternating layers of quarter-wavelength thick deposited dielectric films (e.g., Si and $SiO_2$) or semiconductor distributed Bragg reflectors formed out of a semiconductor material such as Si, GaAs, InP, AlGaAs, InGaAsP, InAlGaAs, InAlAs, AlGaAsSb and/or AlAsSb, or other suitable materials; gain region 20 might comprise a multiple quantum well (MQW) structure, e.g., a structure including InGaAsP, InGaAs, GaAs, AlGaAs, InAlGaAs, InAlAs, AlGaAsSb and/or AlAsSb; front mirror 10 might be spaced from rear mirror 15 by 100 nm–10 cm; gain region 20 might have a thickness of 10 nm–100 um and be spaced from rear mirror 15 by 100 nm–10 cm and be spaced from front mirror 10 by 100 nm–10 cm; and intermediate mirror 25 might be spaced from gain region 20 by 100 nm–10 cm and from front mirror 10 by 100 nm–10 cm.

The present invention may be applied to fixed wavelength lasers (i.e., novel laser 5 may comprise an optically pumped fixed wavelength laser) and to tunable lasers (i.e., novel laser 5 may comprise an optically pumped tunable laser).

In one preferred form of the invention, the optically pumped laser 5 is a tunable vertical-cavity surface-emitting laser (VCSEL) of the sort disclosed in pending prior U.S. patent application Ser. No. 09/105,399, filed Jun. 26, 1998 by Parviz Tayebati et al. for MICROELECTROMECHANICALLY TUNABLE, CONFOCAL, VERTICAL CAVITY SURFACE EMITTING LASER AND FABRY-PEROT FILTER, and in pending prior U.S. patent application Ser. No. 09/543,318, filed Apr. 5, 2000 by Peidong Wang et al. for SINGLE MODE OPERATION OF MICROELECTROMECHANICALLY TUNABLE, HALF-SYMMETRIC, VERTICAL CAVITY SURFACE EMITTING LASERS, and in pending prior U.S. patent application Ser. No. 09/750,434, filed Dec. 28, 2000 by Peidong Wang et al. for TUNABLE FABRY-PEROT FILTER AND TUNABLE VERTICAL CAVITY SURFACE EMITTING LASER. The three aforementioned patent applications are hereby incorporated herein by reference.

Figure 2:
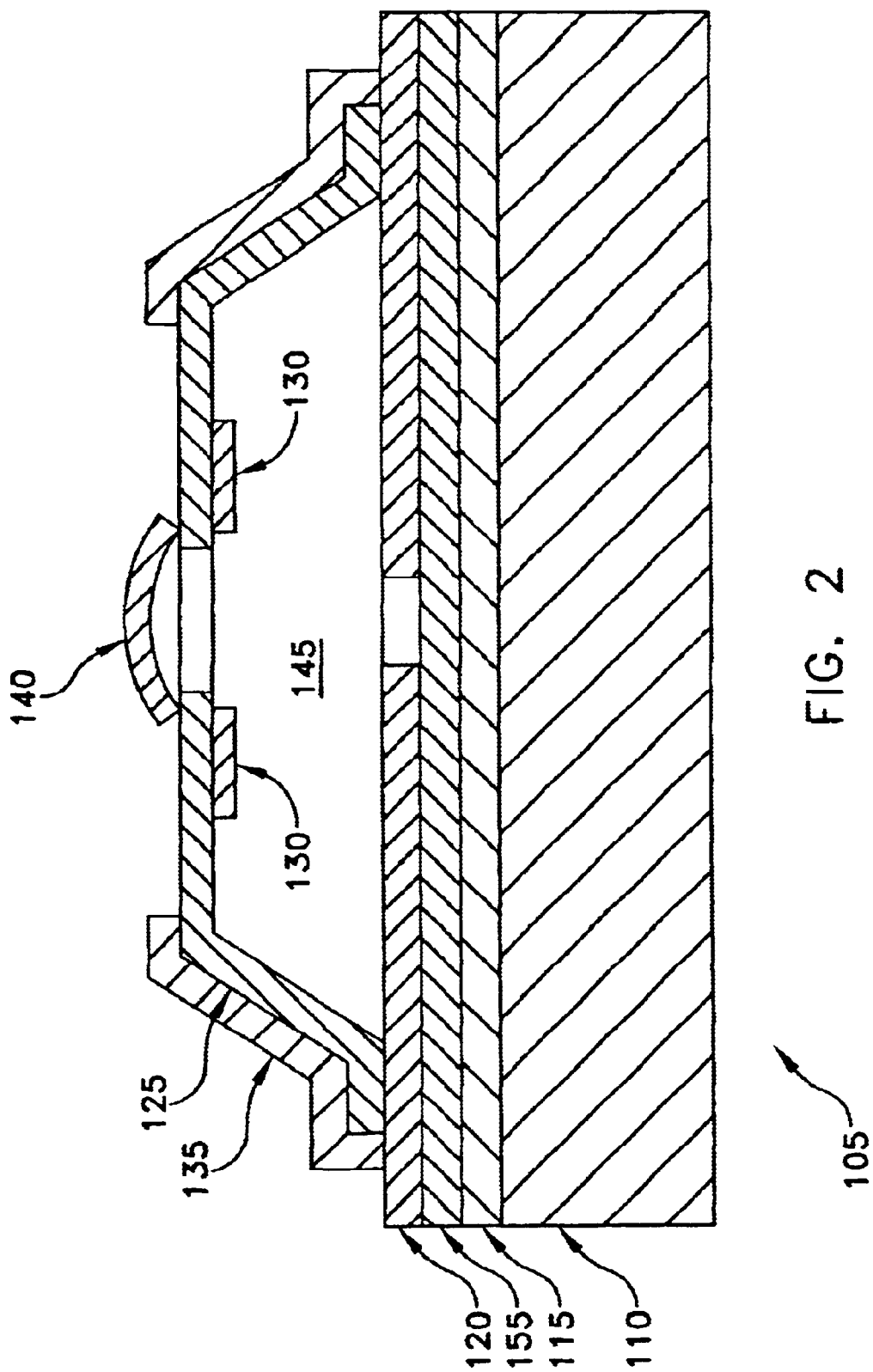
FIG. 2 is a schematic side sectional view of a tunable VCSEL formed in accordance with the present invention.

More particularly, and looking now at FIG. 2, there is shown a tunable VCSEL 105. VCSEL. 105 generally comprises a substrate 110, a bottom mirror 115 mounted to the top of substrate 110, a bottom electrode 120 mounted to the top of bottom mirror 115, a thin membrane support 125 atop bottom electrode 120, a top electrode 130 fixed to the underside of thin membrane support 125, a reinforcer 135 fixed to the outside perimeter of thin membrane support 125, and a confocal top mirror 140 set atop thin membrane support 125, with an air cavity 145 being formed between bottom mirror 115 and top mirror 140.

As a result of this construction, a Fabry-Perot cavity is effectively created between top mirror 140 and bottom mirror 115. Furthermore, by applying an appropriate voltage across top electrode 130 and bottom electrode 120, the position of top mirror 140 can be changed relative to bottom mirror 115, whereby to change the length of the lasing Fabry-Perot cavity.

A gain region (or "active region") 155 is positioned between bottom mirror 115 and bottom electrode 120. As a result, when gain region 155 is appropriately stimulated, e.g., by optical pumping, lasing can be established between top mirror 140 and bottom mirror 115. Furthermore, by applying an appropriate voltage across top electrode 130 and bottom electrode 120, the position of top mirror 140 can be changed relative to bottom mirror 115, whereby to change the length of the laser's resonant cavity, and hence tune VCSEL 105.

In accordance with the present invention, top mirror 140 is substantially fully reflective at the lasing wavelength, and bottom mirror 115 is partially reflective at the lasing wavelength so as to allow a beam of laser light to be emitted therefrom.

The gain region 155 is formed by MQW which are approximately a quarter-wavelength thick so that the gain region will also act as a mirror, i.e., the aforementioned intermediate mirror. In particular, bottom mirror 115 and gain region 155 are reflective at the pump wavelength and are spaced from one another so as to cause the pump light to be reflected between the bottom mirror 115 and gain region 155 so that the pump light will make multiple pumping passes through gain region 155, whereby to yield increased observed, or "wall-plug", efficiencies.

It is to be understood that the present invention is by no means limited to the particular constructions and method steps disclosed above and/or shown in the drawings, but also comprises any modifications or equivalents within the scope of the claims.

What is claimed is:

1. A laser cavity comprising:
   a top mirror and a bottom mirror which are disposed so as to establish a reflective cavity therebetween;
   a gain region disposed between said top mirror and said bottom mirror, said gain region being constructed so that when said gain region is appropriately stimulated by light from a pump laser, said gain region will emit light;
   one of said top mirror and said bottom mirror is substantially fully reflective at the lasing wavelength and the other of said top mirror and said bottom mirror is partially reflective at the lasing wavelength so as to allow a beam of laser light to be emitted therefrom; and
   an intermediate mirror disposed between said bottom mirror and said top mirror, at least a portion of said gain region being disposed between said bottom mirror and said intermediate mirror, said bottom mirror and said intermediate mirror being reflective at the pump wavelength and being spaced from one another so as to cause the pump light to be reflected between said bottom mirror and said intermediate mirror so that the pump light will make multiple pumping passes through said gain region, whereby the multiple pumping passes of the pump light through said gain region causes said laser to yield an increased efficiency.

2. A laser according to claim 1 wherein said gain region is formed by multiple quantum wells (MQW) which act as the intermediate mirror.

3. A laser according to claim 2 wherein said multiple quantum wells comprise at least one of a group consisting of InGaAsP, InGaAs, GaAs, AlGaAs, InAlGaAs, InAlAs, AlGaAsSb and AlAsSb.

4. A laser according to claim 2 wherein said top mirror comprises a distributed Bragg reflector.

5. A laser according to claim 4 wherein said distributed Bragg reflector is formed out of alternating layers of quarter-wavelength thick deposited dielectric films.

6. A laser according to claim 2 wherein said bottom mirror comprises a distributed Bragg reflector.

7. A laser according to claim 6 wherein said distributed Bragg reflector is formed out of alternating layers of quarter-wavelength thick deposited dielectric films.

8. A laser according to claim 1 wherein said top mirror comprises a semiconductor distributed Bragg reflector.

9. A laser according to claim 8 wherein said semiconductor distributed Bragg reflector comprises one of a group consisting of Si, GaAs, InP, AlGaAs, InGaAsP, InAlGaAs, InAlAs, AlGaAsSb and AlAsSb.

10. A laser according to claim 1 wherein said bottom mirror comprises a semiconductor distributed Bragg reflector.

11. A laser according to claim 10 wherein said semiconductor distributed Bragg reflector comprises one of a group consisting of Si, GaAs, InP, AlGaAs, InGaAsP, InAlGaAs, InAlAs, AlGaAsSb and AlAsSb.

12. A laser cavity comprising:
   a top Fabry-Perot cavity for lasing, said first Fabry-Perot cavity having a gain region therein; and
   a bottom Fabry-Perot cavity for pumping, said second Fabry-Perot cavity disposed within a portion of said first Fabry-Perot cavity and encompassing said gain region.

* * * * *